United States Patent
Sasagawa et al.

(10) Patent No.: US 7,098,580 B2
(45) Date of Patent: Aug. 29, 2006

(54) PIEZOELECTRIC OSCILLATOR

(75) Inventors: Ryoma Sasagawa, Kokubu (JP); Hiroyuki Miura, Kokubu (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 11/041,885

(22) Filed: Jan. 24, 2005

(65) Prior Publication Data
US 2005/0212387 A1    Sep. 29, 2005

(30) Foreign Application Priority Data

| Jan. 29, 2004 | (JP) | ............................ 2004-021177 |
| Jan. 29, 2004 | (JP) | ............................ 2004-021957 |
| Jan. 29, 2004 | (JP) | ............................ 2004-022285 |
| Jan. 29, 2004 | (JP) | ............................ 2004-022286 |

(51) Int. Cl.
*H03H 9/05* (2006.01)
*H03H 9/21* (2006.01)
*H01L 41/053* (2006.01)
*H03H 9/215* (2006.01)

(52) U.S. Cl. ................... 310/348; 331/155; 331/158

(58) Field of Classification Search ............... 310/348, 310/365; 331/155–158, 107
See application file for complete search history.

(56) References Cited

U.S. PATENT DOCUMENTS

| 4,164,863 A | * | 8/1979 | Ragsdale ................... 600/405 |
| 5,949,294 A | * | 9/1999 | Kondo et al. ................ 331/68 |
| 2002/0036546 A1 | * | 3/2002 | Hatanaka et al. ............. 331/68 |
| 2002/0044215 A1 | * | 4/2002 | Takagi et al. ............... 348/374 |
| 2004/0155715 A1 | * | 8/2004 | Nakamura et al. .......... 331/158 |
| 2004/0263671 A1 | * | 12/2004 | Takagi et al. ............... 348/340 |

FOREIGN PATENT DOCUMENTS

| JP | 10-098151 | 4/1998 |
| JP | 2000-299611 | 10/2000 |
| JP | 2002-185254 | 6/2002 |
| JP | 2002185254 A | * 6/2002 |
| JP | 2004-129089 | 4/2004 |

OTHER PUBLICATIONS

JP Unexamined Patent Publication No. 10-098151 corresponds to U.S. Patent No. 5,949,294.

* cited by examiner

*Primary Examiner*—Darren Schuberg
*Assistant Examiner*—J. Aguirrechea
(74) *Attorney, Agent, or Firm*—Hogan & Hartson LLP (57) ABSTRACT

A quartz-crystal oscillator has a configuration wherein a rectangular container 1 accommodating a piezoelectric oscillator device 5 therein is fixed to a rectangular supporting substrate 6 on which an IC device 7 is mounted via spacer members 12 formed of metal bodies. On the surface of the supporting substrate 6, part or all of the IC device 7 and side faces of the spacer members are coated with a resin material. When the quartz-crystal oscillator is implemented on a main board by soldering or the like, the problem that the solder for bonding the quartz-crystal oscillator to the main board is adhered to the spacer members 12, thereby causing a short-circuit can be effectively prevented.

14 Claims, 9 Drawing Sheets

PIEZOELECTRIC OSCILLATOR

BACKGROUND OF THE INVENTION

1. Field of the Invention

The present invention relates to a piezoelectric oscillator used for generating a clock signal in telecommunication equipment, electronic equipment, or the like.

2. Description of the Related Art

Clock signal generators (timing devices) for portable communication units and the like have conventionally employed piezoelectric oscillators such as a temperature-compensated quartz-crystal oscillator.

Figure 15:
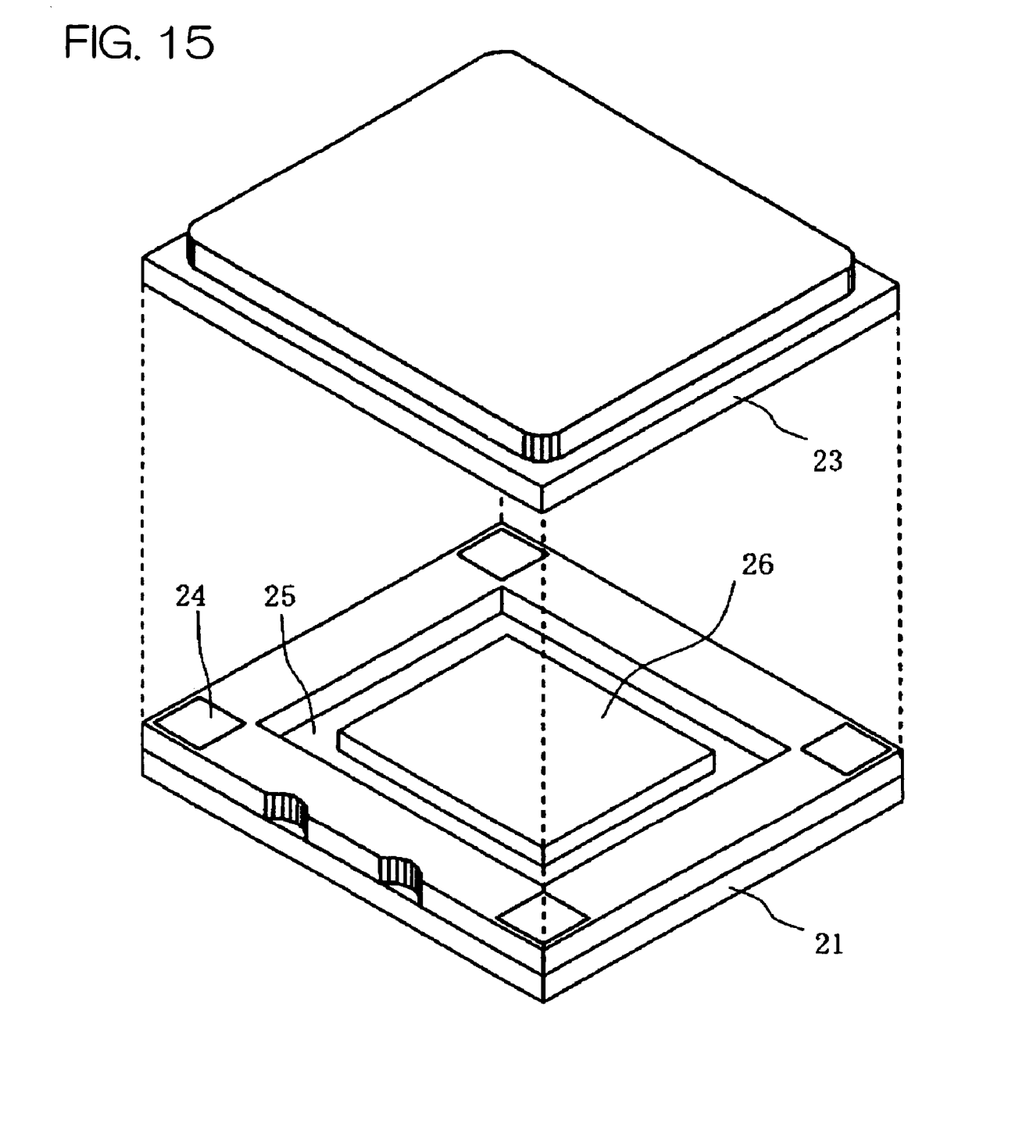
FIG. 15 is an exploded perspective view of a conventional temperature-compensated quartz-crystal oscillator.

As shown in FIG. 15, for example, in the conventional temperature-compensated quartz-crystal oscillator, a package 23 accommodating a quartz-crystal oscillation device therein is attached on a supporting substrate 21 having a recess 25 in a central region on a top face thereof and a plurality of external terminals on a bottom face thereof. The known oscillator is configured so that an IC device 26 for outputting an oscillation signal on the basis of oscillation of the quartz-crystal oscillation device is accommodated in a region surrounded by a bottom face of the package 23 and inner side faces of the recess 25 (refer to Japanese Unexamined Patent Publication No. 10(1998)-98151).

The package 23 and the supporting substrate 21 are normally formed from a ceramic material such as alumina ceramics and manufactured by using a conventionally known green sheet lamination method. On the bottom face of the package 23 and a top face of the supporting substrate 21, respectively, there are provided a plurality of connection electrodes 24 at their corresponding locations and the package 23 is fixed to the top face of the supporting substrate 21 by bonding these connection electrodes 24 to each other by way of a conductive bonding material.

However, in the above-mentioned conventional piezoelectric oscillator, oxidization corrosion of metal bodies forming connection electrodes 24 cannot prevent and reliability of the piezoelectric oscillator cannot be fully maintained.

Moreover, since the recess 25 having a dimension large enough to accommodate the IC device 26 needs to be formed in the supporting substrate 21, the area of the supporting substrate 21 becomes larger than IC device 26 in both of the lengthwise and breadthwise directions, thereby making miniaturization of the piezoelectric oscillator difficult.

Further, due to the recess 25, it is impossible to make the most of the region on the surface of the supporting substrate 21 in which the connection electrodes 24 do not exist. That is, the level difference of the recess 25 leads to an disadvantage that the IC device and other electronic parts cannot be mounted.

An object of the present invention is to provide a piezoelectric oscillator in which oxidative corrosion of metal bodies can be prevented.

Another object of the present invention is to provide a piezoelectric oscillator capable of reducing its whole configuration in size and making the most of the surface of the supporting substrate.

SUMMARY OF THE INVENTION

The piezoelectric oscillator has a package for accommodating a piezoelectric oscillation device therein and a supporting substrate on which an IC device for outputting an oscillation signal corresponding to a resonance frequency of the piezoelectric oscillation device is mounted. Pole-like metal bodies are arranged along an outer periphery of a main face of the supporting substrate on which the IC device is mounted and on the main face, part or all of the IC device and at least inner side faces of the metal bodies, which face the IC device, are coated with a resin material.

In the piezoelectric oscillator, since part or all of the IC device is coated with the resin material and at least inner side faces of the metal bodies, which face the IC device, are also coated with the resin material, oxidative corrosion of the IC device and the metal bodies can be prevented effectively. This gives an advantage that a high reliability of the piezoelectric oscillator can be maintained and bonding strength between the supporting substrate and the metal bodies can be increased by using the resin material.

The package may be configured so as to be seated on/fixed to the supporting substrate via spacer members formed of the metal bodies which are disposed along the outer periphery of the main face of the supporting substrate.

In this case, since the package which accommodates the piezoelectric oscillation device therein is fixed to the supporting substrate on which the IC device is mounted via the spacer members, all of the region where no spacer member exists is applicable to the mounting of the IC device and other electronic parts.

In the case where the side faces of the spacer members are coated with the resin material over the whole perimeter, when the piezoelectric oscillator is implemented on the external wiring substrate such as a main board by soldering or the like, such a trouble that the solder for bonding the piezoelectric oscillator to the external wiring substrate is adhered to the spacer members formed of the metal bodies, causing a short-circuit can be prevented effectively. This leads to an easy handling of the piezoelectric oscillator.

The spacer members each are attached at four corners on the main face of the supporting substrate, the region where no spacer member exists of the main face (top face) of the supporting substrate can be used to the maximum. In addition, when the IC device is designed to be located between the adjacent spacer members, the size of the supporting substrate can be minimized. This enables reduction in the whole configuration of the piezoelectric oscillator in size.

Given that the spacer members are electrically connected with the wiring conductors of the supporting substrate and connection electrodes of the package, with the package being seated on/fixed to the supporting substrate, even if the wiring for connection is not provided specially, the piezoelectric oscillation device can be electrically connected with the IC device and other electronic parts mounted on the top face of the supporting substrate.

The piezoelectric oscillator of the present invention may have the configuration where at least inner side faces of the spacer members are inclined so that its upper region near the package becomes smaller than its lower region near the supporting substrate and the resin material is adhered to the inclined faces.

With this configuration, the angle which the spacer members form with the top face of the supporting substrate becomes an obtuse angle. Accordingly, when the resin material for coating the IC device is formed, liquid resin before hardening easily flows between the spacer member and IC device, and therefore the sealing property of the IC device can be improved.

Since the spacer members are individually attached at four corners on the main face of the supporting substrate and a vertical section of each spacer member is formed substantially in the shape of a trapezoid, space between the spacer members and the IC device becomes larger efficiently and liquid resin before hardening flows between the spacer members and the IC device more easily. Accordingly, the sealing property of the IC device can be further improved.

When the package and the supporting substrate are made to have the substantially same outside dimension, the size of the supporting substrate can be minimized. This enables reduction in the whole configuration of the piezoelectric oscillator in size.

The package may be seated on/fixed to the other main face of the supporting substrate and mounting legs formed of the metal bodies may be arranged along the outer periphery of the main face on the opposite side of the other main face to which the package is fixed.

In this case, since the package is fixed to the other main face of the supporting substrate and the IC device for oscillation output and the mounting legs are attached to the main face of the supporting substrate, all of the region where no mounting leg exists of the main face (bottom face) of the supporting substrate is applicable to the mounting the IC device and other electronic part. This enables reduction in the whole configuration of the piezoelectric oscillator in size.

Especially when the mounting legs are attached to four corners on the main face of the supporting substrate, by designing so as to dispose the IC device between the adjacent mounting legs, the size of the supporting substrate can be minimized. This enables reduction in the whole configuration of the piezoelectric oscillator in size.

In the case where the side faces of the mounting legs are coated with the resin material over the whole perimeter, when the piezoelectric oscillator is implemented on the external wiring substrate such as a main board by soldering or the like, such a trouble that the solder for bonding the piezoelectric oscillator to the external wiring substrate climes through the mounting legs formed of the metal bodies can be prevented effectively. This leads to an easy handling of the piezoelectric oscillator.

Given that the mounting legs mounted on the main board electrically connects the terminals of the IC device with wiring conductors of the main board, even if the wiring for connection is not provided specially, the IC device can be electrically connected with the wiring formed on the top face of the supporting substrate.

With the configuration where at least inner side faces of the mounting legs are inclined so that its upper region near the supporting substrate becomes larger than its lower region near the opposite end part, the angle which the mounting legs form with the bottom face of the supporting substrate becomes an obtuse angle. Accordingly, when the resin material for coating the IC device is formed, liquid resin before hardening easily flows between the mounting legs and IC device, and therefore the sealing property of the IC device can be improved.

Especially when the mounting legs are individually attached at four corners on the surface of the supporting substrate, since the vertical section of each mounting leg is formed substantially in the shape of a trapezoid, liquid resin before hardening flows between the mounting legs and the IC device more easily. Accordingly, the sealing property of the IC device can be further improved.

The above-mentioned and other advantages, features and effects will appear more fully hereinafter from a consideration of the following description with reference to the accompanying drawings.

DETAILED DESCRIPTION OF PREFERRED EMBODIMENTS

The present invention will be described in detail with reference to accompanying drawings.

Figure 1:
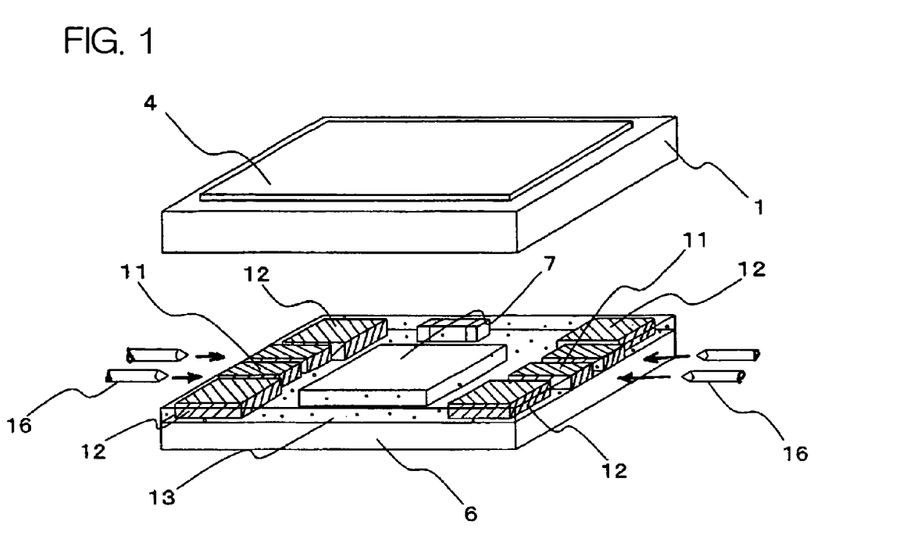
FIG. 1 is an exploded perspective view showing an embodiment of a temperature-compensated quartz-crystal oscillator using a piezoelectric oscillator of the present invention.
Figure 2:
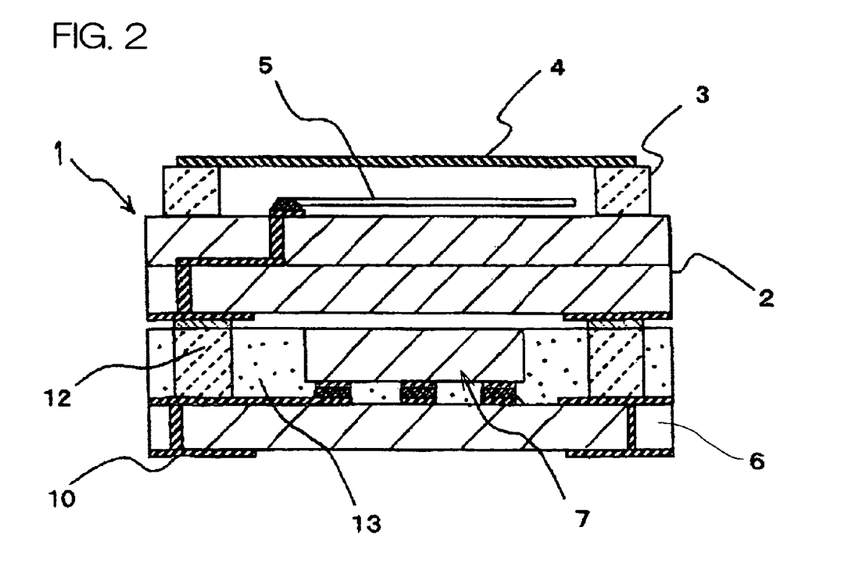
FIG. 2 is a sectional view showing the completed temperature-compensated quartz-crystal oscillator of FIG. 1.

FIG. 1 is an exploded perspective view showing a temperature-compensated quartz-crystal oscillator using a piezoelectric oscillator of the present invention, and FIG. 2 is a sectional view of the temperature-compensated quartz-crystal oscillator of FIG. 1.

The temperature-compensated quartz-crystal oscillator shown in FIGS. 1 and 2 has a rectangular package 1 accommodating a quartz-crystal oscillation device 5 as a piezoelectric vibrator therein and a supporting substrate 6 having a plurality of external terminals 10 on a bottom face thereof and an IC device 7 on a top face thereof. The package 1 is seated on/fixed to the supporting substrate via spacer members 12. The outside dimension of the package 1 and the outside dimension of the supporting substrate 6 in every direction are substantially equal in a plan view.

The package 1 includes a substrate 2 formed from a ceramic material such as glass ceramic and alumina ceramics, seal rings 3 formed from a metal such as 42 alloy, kovar and phosphor bronze, and a closure 4 formed from the same metal as the seal rings 3. The package 1 is configured by attaching the seal rings 3 to a top face of the substrate 2 and mounting/fixing the closure 4 thereon. The quartz-crystal oscillator device 5 is implemented on the top face of the substrate 2 located inner side of the seal rings 3.

The package 1 serves to accommodate the quartz-crystal oscillator device 5 therein, more specifically, within a space enclosed by the top face of the substrate 2, inner side faces of the seal rings 3 and a bottom face of the closure 4 for hermetic sealing. On the top face of the substrate 2, there are provided a pair of mounting pads connected to oscillating electrodes of the quartz-crystal oscillation device 5 and on the bottom face of the substrate 2, there are provided a plurality of connection electrodes connected to the spacer members 12 described later. The respective mounting pads and connection electrodes are electrically connected to each other via wiring conductors on the surface of the substrate 2 and a via hole conductor buried within the substrate 2.

In the case where the substrate 2 of the package 1 is formed from ceramic material such as glass ceramic, the substrate 2 may be manufactured as follows, for example. A conductive paste to define a wiring conductor is applied to a surface of a ceramic green sheet formed from a mixture including ceramic powder, an suitable organic solvent and the like by the conventionally known screen printing method or the like. The ceramic green sheet are stacked on multiple layers and press-formed into a laminate of ceramic green sheets. The laminate of ceramic green sheets is sintered at high temperatures.

The seal rings 3 and the closure 4 are manufactured using a conventionally known metal working method wherein a metal such as 42 alloy is worked into a predetermined shape, and the seal rings 3 thus obtained are brazed to a conductor layer previously deposited on the top face of the substrate 2.

Subsequently, after implementing and fixing the quartz-crystal oscillator device 5 on the top face of the substrate 2 by use of a conductive adhesive, the above-mentioned closure 4 is bonded to the top faces of the seal rings 3 by conventionally known resistance welding or the like to assemble the package 1. In the case of bonding the seal rings 3 and the closure 4 by resistance welding or the like in this manner, a Ni-plate layer or Au-plate layer is previously deposited on surfaces of the seal rings 3 and the closure 4.

In the above-mentioned embodiment, the closure 4 of the package 1 is bonded to the substrate 2 via the seal rings 3. However, an alternative approach may be taken. That is, a metallize pattern for bonding is formed on the top face of the substrate 2 and the closure 4 is directly welded to the metallize pattern.

Furthermore, in the above-mentioned embodiment, the seal rings 3 are directly attached to the top face of the substrate of the package 1. However, an alternative approach may be taken. That is, a frame body formed from the same ceramic material as the substrate 2 is integrally attached on the top face of the substrate 2 and then the seal rings 3 are attached on the top face of the frame body.

On the other hand, the quartz-crystal oscillator device 5 accommodated in the package 1 is formed by depositing a pair of oscillation electrodes on both main planes of a quartz slice obtained by cutting quartz from a predetermined crystal axis. When an external variable voltage is applied to the quartz slice via the pair of oscillation electrodes, the quartz slice encounters thickness shear oscillation electrodes at given frequencies.

By electrically connecting the pair of oscillation electrodes with the respective corresponding mounting pads on the top face of the substrate via the conductive adhesive, the quartz-crystal oscillation device 5 is mounted on the top face of the substrate 2. As a result, electrical and mechanical connection between the quartz-crystal oscillation device 5 and the package 1 can be accomplished simultaneously.

When The closure 4 of the package 1 is connected with the ground terminals of the external terminals 10 disposed on the bottom face of the supporting substrate 6 via the wiring conductors formed on the package 1 or the supporting substrate 6, this connection provides the grounding of the closure 4 so that the closure 4 has a shielding function. Accordingly, the quartz-crystal oscillation device 5 and the IC device 7 can be preferably protected from unwanted external electrical effects. Therefore, it is preferred that the closure 4 of the package 1 is electrically connected with the ground terminals of the external terminals 10 via the wiring conductors of the package 1 and the supporting substrate 6.

The supporting substrate 6 which the package 1 is seated on/fixed to has a substantially rectangular shape and the spacer members 12 are individually attached and vertically arranged at four corners on the main face (top face) of the supporting substrate 6. And IC device 7 is mounted in the central region on the top face of the supporting substrate surrounded by these spacer members 12.

The supporting substrate 6 serves to support the package 1 via the spacer members 12 and is formed in a flat plane using any of the following materials including glass-cloth based resins, resin materials such as polycarbonate, epoxy resins and polyimide resins, and ceramic materials such as glass-ceramics and alumina-ceramics.

Especially in the case the supporting substrate 6 is formed from a resin material, when the supporting substrate is mounted on an external wiring board formed from a resin material such as a main board or the like, the thermal expansion coefficient of the external wiring board becomes close to that of the supporting substrate. Accordingly, high capability can be achieved especially in the environment where a large temperature change is repeated.

The spacer members 12 vertically arranged on the top face of the supporting substrate 6 each are formed of a metal post obtained by forming a metal material such as copper in a square pole. The spacer members 12 are electrically and mechanically connected with the wiring conductors of the supporting substrate 6 at the lower end thereof and with connection electrodes on the bottom face of the package 1 at the top end thereof via conductive bonding materials such as solder.

To achieve a good bonding condition of the conductive bonding materials with the package 1, a Ni-plate layer or Au-plate layer with a predetermined thickness is deposited on the top faces of the spacer members 12.

The supporting substrate 6 is provided with four external terminals 10 (a source voltage terminal, a ground terminal, an oscillation output terminal and an oscillation control terminal) on the other main face (bottom face) thereof. When the temperature-compensated quartz-crystal oscillator is mounted on the external electrical circuits such as a main board (not shown), these external terminals 10 are electrically connected with circuit wirings of the external electrical circuits by means of soldering or the like.

Here, when the ground terminal and the oscillation output terminal among the four external terminals 10 are arranged adjacent to each other, it is possible to effectively prevent noise from interfering with an oscillation signal outputted from the oscillation output terminal. Therefore, it is preferred that the ground terminal and the oscillation output terminal are arranged adjacent to each other.

A plurality of electrode pads are formed by being deposited in a central region of the top face of the above-mentioned supporting substrate 6 and the IC device 7 is mounted in the region wherein the electrode pads are formed.

The IC device 7 may employ a rectangular flip-chip type IC, which includes a plurality of connection pads each corresponding to the respective electrode pads of the supporting substrate 6 on a bottom face thereof.

On the IC device 7, there are provided a temperature sensor (thermistor) for sensing the ambient temperatures, a memory for storing temperature compensation data for compensating for the temperature characteristics of the quartz-crystal oscillation device 5, a temperature compensating circuit operating based on the temperature compensation data thereby compensating for the temperature characteristics of the quartz-crystal oscillation device 5 according to the temperature variations, an oscillation circuit connected with the temperature compensation circuit and operative to generate a predetermined oscillation output, and the like. The oscillation output generated by the oscillation circuit is outputted externally and then is used as a reference signal such as a clock signal.

The IC device 7 is attached to the supporting substrate 6 by individually connecting the connection pads formed on the mounting face (bottom face) of the IC device 7 with the corresponding electrode pads on the top face of the supporting substrate 6 via the conductive bonding material such as solder and gold bump. This allows the electric circuits in the IC device 7 to be electrically connected with the quartz-crystal oscillation device 5, the external terminals 10 and the like via the wiring conductors through the package 1, the wiring conductors through the supporting substrate 6 and the like.

When the above-mentioned supporting substrate 6 is formed using a glass-cloth based epoxy resin, a base of the substrate is formed by impregnating a glass-cloth base with a liquid precursor and polymerizing the precursor at high temperatures, the glass-cloth base formed by weaving glass fiber.

The spacer members 12 and the wiring conductors may be formed by plating or printing a top face of the base of the supporting substrate 6 with a metal film made of copper or the like so as to have a predetermined thickness and pattern. Alternatively, a metal film may be uniformly formed on the top face of the base of support substrate 6 in a predetermined thickness and pattern, and then the metal film may be selectively removed by means of photograph etching or the like to have a predetermined pattern. Alternatively, a metal film may be formed on the top face of the supporting substrate 6 by the above-mentioned method, a metal bump may be provided on it, and the bump may constitute spacer members 12.

Although the shape of the spacer members 12 is a square pole in FIG. 1 and the like, it is not restricted to a square pole, and may be a cylindrical column or triangle pole.

When the package 1 is seated on/fixed to the supporting substrate 6 via the spacer members 12, they are electrically and mechanically connected with each other by contacting the top faces of the spacer members 12 against the corresponding connection electrodes on the bottom face of the package 1 via the conductive bonding material such as a solder and then allowing the conductive bonding material to be molten by application of heat.

This conductive bonding material is not restricted to general conductive materials such as a solder. For example, an anisotropic conductive bonding material may be used as the conductive bonding material. In this case, attachment operation of the package 1 to the supporting substrate 6a becomes extremely simple and hence, the assembling process of the temperature-compensated quartz-crystal oscillator is further simplified.

The space between the bottom face of the IC device 7 and the supporting substrate 6 is filled with a resin material 13 formed of epoxy resin, for example. The resin material 13 is formed to improve bonding strength of the IC device 7 to the supporting substrate 6 and to protect wiring conductors formed on the main face of the supporting substrate 6. Further, the resin material 13 not only fills the space between the bottom face of the IC device 7 and the supporting substrate 6 but is deposited on the side faces of IC device 7.

The quantity of the resin material 13 may be increased so as to cover the top face of IC device 7.

The resin material 13 also exists in the vicinity of an outer periphery of the supporting substrate 6 in a plan view. The resin material 13 fills space between adjacent spacer members 12 and also covers the side faces of the spacer members 12.

As mentioned above, such resin material 13 exists in the vicinity of the outer periphery of the supporting substrate 6 to cover the side faces of the spacer members 12 with a thickness of 20 to 250 μm, for example. Accordingly, when the temperature-compensated quartz-crystal oscillator is implemented on the external wiring substrate such as a main board by soldering or the like, such a trouble that the solder for bonding the temperature-compensated quartz-crystal oscillator to the external wiring substrate is adhered to the spacer members 12 formed of metal bodies, thereby causing a short-circuit can be prevented effectively. This leads to an easy handling of the temperature-compensated quartz-crystal oscillator.

Further, since the side faces of the spacer members 12 are coated with the resin material 13, oxidative corrosion of the metal bodies forming the spacer members 12 can be prevented effectively. This gives an advantage that a high reliability of the temperature-compensated quartz-crystal oscillator can be maintained and bonding strength between the supporting substrate 6 and the spacer members 12 can be increased by using the resin material 13.

It is preferred to coat 90% or more of the whole area of the spacer members 12 with the resin material 13. However, even if about 25% of the side faces of the spacer members 12 are exposed from the upper ends, the other parts should just be coated with the resin material 13. Even in this case, the short-circuit due to adhesion of the solder in the mounting to the external wiring substrate can be prevented effectively and there occurs almost no influence of oxidative corrosion caused by contact with the moisture contained in the atmosphere or the like.

In the case where the above-mentioned resin material 13 is formed from a transparent material, even when the side faces of the IC device 7 are coated with the resin material 13, the IC device 7 can be directly observed from between the adjacent spacer members 12. In product inspection or the like, therefore, a junction between the IC device 7 and the supporting substrate 6 can be checked. This also contributes to the improved workability of the inspection.

A plurality of write control terminals 11 for writing temperature compensation data into the IC device 7 are intervened between the package 1 and the supporting substrate 6.

Similarly to the spacer members 12 described above, the write control terminals 11 each are formed of a metal post obtained by forming a metal material such as copper in the shape of a pole and are attached to the top face of the supporting substrate 6 so that part of the side faces thereof is exposed from between the side faces of the package 1 and the supporting substrate 6. The exposed faces of the write control terminals 11 need to be made so as not to be coated with the above-mentioned resin material 13 in order to obtain an electric connection with a probe (described later).

After assembling the temperature-compensated quartz-crystal oscillator, the temperature compensation data is stored into the memory in the IC device 7 by inputting the temperature compensation data with a probe 16 of a temperature-compensation-data wiring device contacted against the write control terminals 11 sideways.

The write control terminals 11 are provided along the side face of the supporting substrate 6 and electrically connected with the IC device 7 via the wiring conductors through the supporting substrate 6 and the like. In this embodiment, the number of the write control terminals 11 is set to be 2N (N is natural number), say 4 and the four write control terminals 11 are disposed in twos along two sides of the supporting substrate 6, which are parallel to each other, symmetrically with respect to a central line parallel to the two sides. When the temperature compensation data is written into the IC device with the probe 16 of the temperature-compensation-data writing device contacted against the four write control terminals 11 sideways, force from the probe 16 is applied uniformly from both sides of the supporting substrate 6 and the package 1. For this reason, it is possible to hold the supporting substrate 6 and the package 1 in good condition during writing and to effectively prevent damage of the write control terminals 11 due to an unbalanced stress caused by the contact with the probe 16.

It is preferred that the top end of each write control terminal 11 is bonded to a dummy connection pad provided on the bottom face of the package 1 via a bonding material. This enables increase in bonding strength between the supporting substrate 6 and the package 1, thereby maintaining a higher reliability of the temperature-compensated quartz-crystal oscillator.

By forming the write control terminals 11 for writing the temperature compensation data into the IC device 7 from metal bodies and allowing part of the write control terminals 11 to be exposed from between the side faces of the package 1 and the supporting substrate, in assembling the temperature-compensated quartz-crystal oscillator, the temperature-compensated quartz-crystal oscillator can be manufactured by only attaching the metal write control terminals 11 to predetermined positions of the top face of the supporting substrate to manufacture and hence, productivity of the temperature-compensated quartz-crystal oscillator can be improved.

Accordingly, the above-mentioned temperature-compensated quartz-crystal oscillator, which is mounted on the external wiring substrate such as a main board by soldering or the like, carries out its functions by outputting a predetermined oscillation signal according to the resonance frequency of the quartz-crystal oscillation device 5 while compensating an oscillation output in the temperature compensating circuit of the IC device 7.

Next, a temperature-compensated quartz-crystal oscillator using a piezoelectric oscillator in accordance with another embodiment of the present invention will be described.

Figure 3:
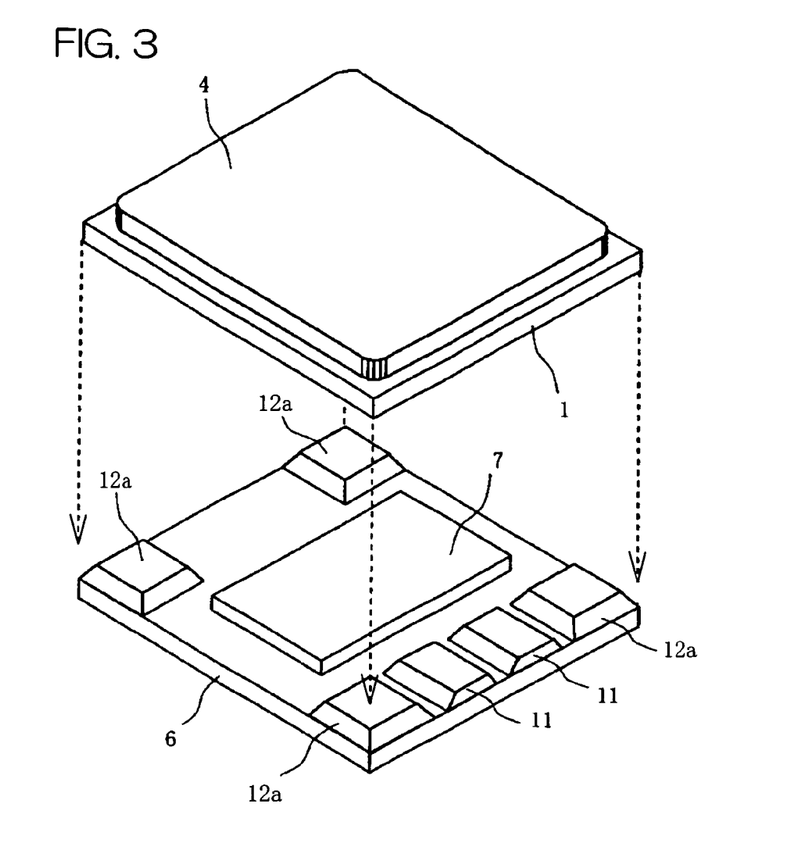
FIG. 3 is an exploded perspective view showing another embodiment of a temperature-compensated quartz-crystal oscillator using the piezoelectric oscillator of the present invention.
Figure 4:
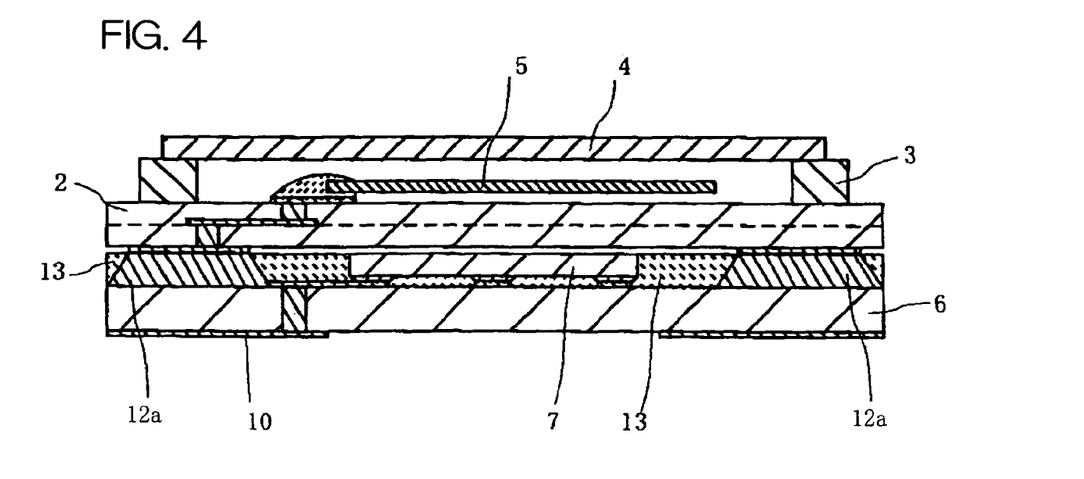
FIG. 4 is a sectional view showing the completed temperature-compensated quartz-crystal oscillator of FIG. 3.

FIG. 3 is an exploded perspective view of the temperature-compensated quartz-crystal oscillator and FIG. 4 is a sectional view of the temperature-compensated quartz-crystal oscillator of FIG. 3.

The temperature-compensated quartz-crystal oscillator shown in FIGS. 3 and 4 includes the rectangular package 1 accommodating the quartz-crystal oscillation device 5 as a piezoelectric oscillation device therein and the rectangular supporting substrate 6 having a plurality of external terminals 10 on its bottom face and the IC device 7 on its top face. The package 1 is seated on/fixed to the supporting substrate 6 via spacer members 12a.

The difference between the temperature-compensated quartz-crystal oscillator shown in these figures and the temperature-compensated quartz-crystal oscillator described above is in the shape of the spacer members 12a.

In other words, similar to the spacer members shown in FIG. 1, the spacer members 12a attached and vertically arranged on the top face of the supporting substrate 6 each are formed from a metal body such as copper. However, the four side faces of each spacer member 12a are inclined so that the cross-section area of the top region of the spacer member 12a relatively near the package 1 may become smaller than the cross-section area of the bottom region relatively near the supporting substrate 6. That is, the spacer members 12a are formed in the shape of a quadrangular pyramid. An angle of gradient of the side faces is set so that the angle which the side faces form with a direction perpendicular to the main face of supporting substrate 6 may become 5 to 30 degrees.

Although all of the four side faces of each spacer member 12a are inclined in FIG. 3, all of the four side faces need not be inclined and at least an inner side face of the spacer member 12a (that is, the side face facing the IC device 7) need only be inclined.

The metal spacer member 12a as a metal body, side face of which is inclined as mentioned above, is obtained by processing a metal foil such as a copper foil adhered to the surface of the supporting substrate 6 into a predetermined pattern by using a subtractive method.

By inclining at least inner side faces of the spacer members 12a so that the cross-section area of the top region may become smaller than that of the bottom region, when the resin material 13 for coating the IC device 7 is introduced, liquid resin before hardening easily flows between the spacer member 12a and IC device 7, and therefore the sealing property of the IC device 7 can be improved.

Moreover, since the spacer members 12a are individually attached at four corners on the top face of the supporting substrate 6 and the vertical section of each spacer member 12a is formed in the shape of a trapezoid, space between the spacer members 12a and the IC device 7 becomes larger and liquid resin before hardening flows between the spacer members 12a and the IC device 7 more easily. Accordingly, the sealing property of the IC device 7 can be further improved.

Although the shape of the spacer members 12 is a quadrangular pyramid in FIG. 3 and the like, the shape is not restricted to the quadrangular pyramid and may be a frustum, hemisphere or triangular pyramid.

Another embodiment of the present invention will be described in detail.

Figure 5:
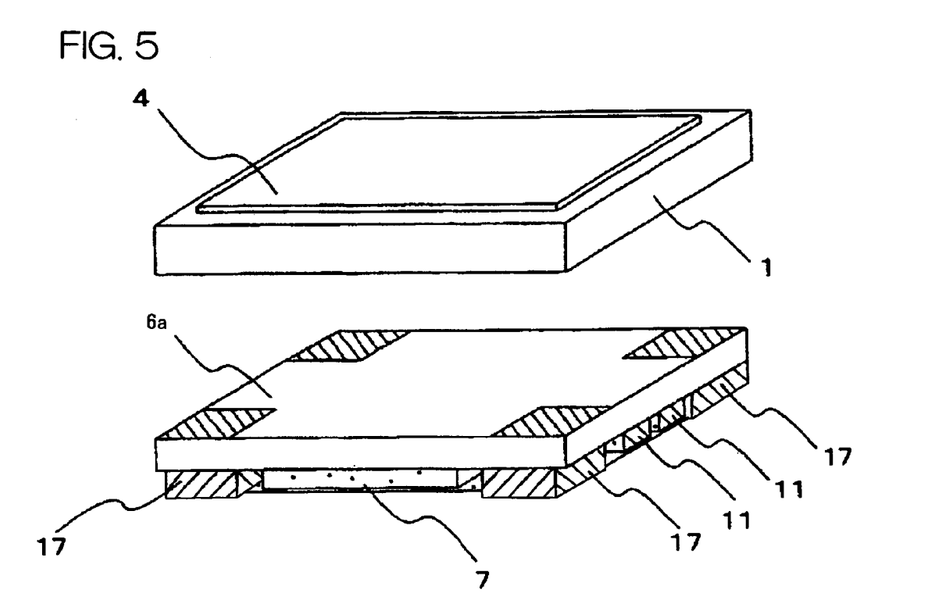
FIG. 5 is an exploded perspective view showing another embodiment of a temperature-compensated quartz-crystal oscillator using the piezoelectric oscillator of the present invention.
Figure 6:
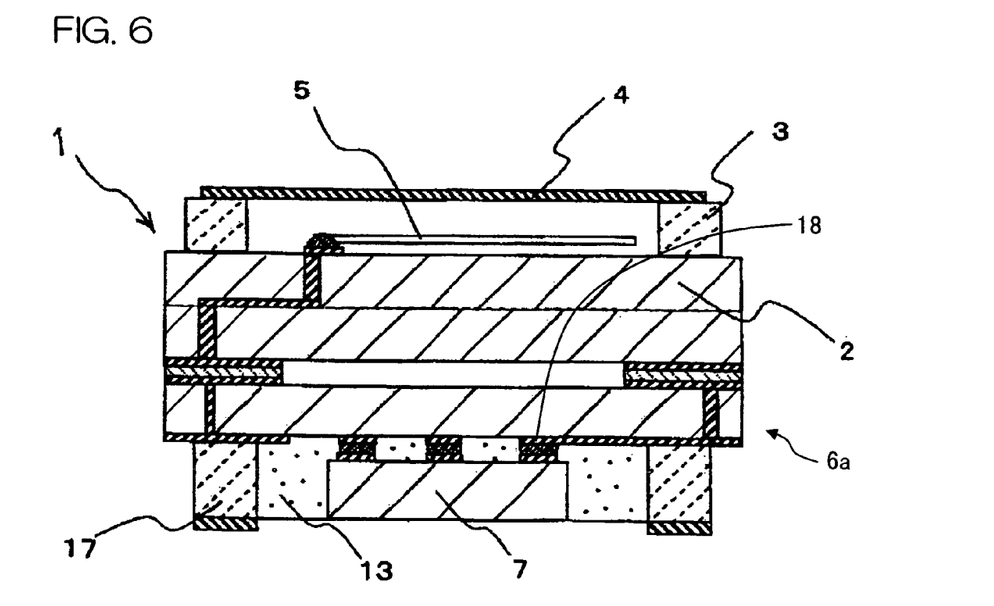
FIG. 6 is a sectional view showing the completed temperature-compensated quartz-crystal oscillator of FIG. 5.
Figure 7:
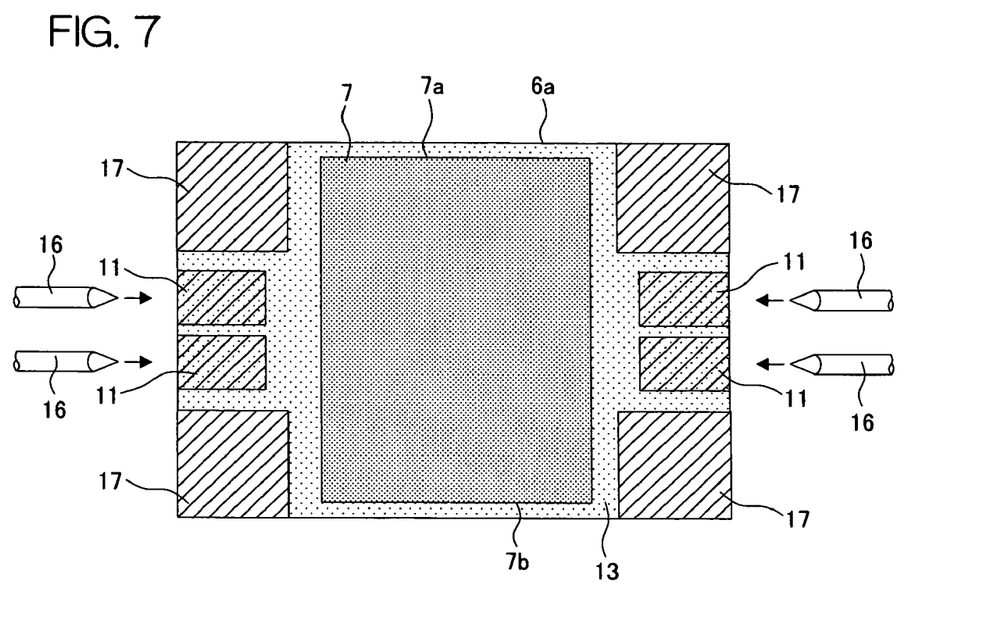
FIG. 7 is a bottom view of the temperature-compensated quartz-crystal oscillator of FIG. 5 when viewed from the bottom.

FIG. 5 is an exploded perspective view showing an embodiment of a temperature-compensated quartz-crystal oscillator using a piezoelectric oscillator of the present invention, FIG. 6 is a cross-sectional view of the temperature-compensated quartz-crystal oscillator in FIG. 5 and FIG. 7 is a bottom view of the temperature-compensated quartz-crystal oscillator in FIG. 5 when viewed from the bottom.

The temperature-compensated quartz-crystal oscillator shown in these figures has the configuration in which a substantially rectangular package 1 accommodating the quartz-crystal oscillation device 5 therein is fixed on a supporting substrate 6a and the IC device 7 and a plurality of mounting legs 17 are attached to a main face (bottom face) of the supporting substrate 6a.

The configuration of the package 1 is similar to that as described with reference to FIGS. 1 and 2.

However, the configuration of the supporting substrate 6a for mounting/fixing the package 1 thereon is different from that of the supporting substrate 6 described with reference to FIGS. 1 and 2.

That is, in this embodiment, the plurality of mounting legs 17 and the plurality of write control terminals 11 are attached along an outer periphery on a bottom face of the supporting substrate 6a. The mounting legs 17 are individually attached and vertically arranged at four corners on the bottom face of the supporting substrate 6 and two write control terminals 11 are attached and vertically arranged between adjacent mounting legs 17, respectively.

On the bottom face of the supporting substrate, the IC device 7 is mounted in a central region surrounded by the four mounting legs 17 and the four (2×2) write control terminals 11. The supporting substrate 6a supports the above-mentioned package 1 on the top face thereof and supports the IC device 7, the write control terminals 11 and the mounting legs 17 on the bottom face thereof by using a general conductive bonding material such as a solder.

Instead of solder, an anisotropic conductive bonding material may be used as the conductive bonding material. In this case, attachment operation of the IC device 7, the mounting legs 17 and the like to the supporting substrate 6a becomes extremely simple and hence, the assembling process of the piezoelectric oscillator is further simplified.

The supporting substrate 6a is formed in a flat plane using any of the following materials including glass-cloth based resins, resin materials such as polycarbonate, epoxy resins and polyimide resins, and ceramic materials such as glass-ceramics and alumina-ceramics.

The plurality of mounting legs 17 attached and vertically arranged on the bottom face of the supporting substrate 6a each are formed of a metal body obtained by forming a metal material such as copper in a square pole.

Although the shape of the mounting legs 17 is a square pole in FIG. 5 and the like, the shape is not restricted to a square pole and may be a column or triangle pole. When the temperature-compensated quartz-crystal oscillator is implemented on the external wiring substrates such as a main board (not shown), the mounting legs 17 are electrically connected with wirings of external electrical circuits by means of soldering or the like.

The above-mentioned four mounting legs 17 function as a source voltage terminal, a ground terminal, an oscillation output terminal and an oscillation control terminal, respectively. To achieve a good bonding condition of the soldering and the like with the external wiring substrate, a Ni-plate layer, Au-plate layer or the like with a predetermined thickness is deposited on the bottom faces of these mounting legs 17.

When the ground mounting leg 17 and the oscillation output mounting leg 17 among the four mounting legs 17 are disposed adjacent to each other, it is possible to effectively prevent noise from interfering with an oscillation signal output from the oscillation output terminal. Therefore, it is preferred that the ground mounting leg 17 and the oscillation output mounting leg 17 are arranged adjacent to each other.

On the other hand, since the function of the IC device 7 attached to the bottom face of the supporting substrate 6a is similar to that described with reference to FIGS. 1 and 2, redundant description will be omitted.

The IC device 7 is arranged inner from the mounting legs 17 and exposed from between the adjacent mounting legs 17, with its two side faces 7a, 7b disposed in substantially parallel relation being coated with a resin material 13 described later (see FIG. 7).

The exposed side faces 7a, 7b of the IC device 7 are located slightly inwardly of outer peripheries of the package 1 and the supporting substrate 6a, say 1 μm to 500 μm inwardly of the outer periphery of the supporting substrate 6a. In this way, since a widthwise dimension of the supporting substrate 6 with respect to a direction orthogonal to the exposed side faces 7a, 7b of the IC device 7 is designed to be substantially equal to the length of one side of the IC device 7, the whole configuration of the temperature-compensated quartz-crystal oscillator can be reduced in size.

On the bottom face of the supporting substrate 6a on which the IC device 7 are arranged electrode pads 18 each corresponding to the respective connection pads of the IC device 7. By bonding these electrode pads 18 to the connection pads of the IC device 7 via conductive jointing materials such as solder and golden vamp, the IC device 7 is attached and implemented on the bottom face of supporting substrate 6a. This allows electrical circuits in the IC device 7 to be electrically connected with the quartz-crystal oscillation device 5, the mounting legs 17 and the like via the wiring pattern through the package 1, the wiring pattern through the supporting substrate 6a and the like.

The space between the top face (mounting face to the supporting substrate) of the IC device 7 and the bottom face of the supporting substrate 6a is filled with the resin material 13 formed of an epoxy resin or the like. The resin material 13 not only fills the above-mentioned space above the top face of the IC device 7 but is deposited on the side faces of IC device 7.

The quantity of the resin material 13 may be increased so as to cover the bottom face of IC device 7.

The resin material 13 also exists in the vicinity of the outer periphery of the supporting substrate 6a in a plan view. The resin material 13 fills space between adjacent mounting legs 17 and also covers at least the inner faces of the mounting legs 17.

As mentioned above, such resin material 13 exists in the vicinity of the outer periphery of the supporting substrate 6 to cover the side faces of the mounting legs 17 with a thickness of 20 to 250 μm, for example. Accordingly, when the temperature-compensated quartz-crystal oscillator is implemented on the external wiring substrate such as a main board by soldering or the like, such a trouble that the solder for bonding the temperature-compensated quartz-crystal oscillator to the external wiring substrate is adhered to the mounting legs 17 formed of metal bodies, thereby causing a short-circuit can be prevented effectively. This leads to an easy handling of the temperature-compensated quartz-crystal oscillator.

Moreover, in this case, since the side faces of the mounting legs 17 are coated with the resin material 13, oxidative corrosion of the metal bodies forming the mounting legs 17 can be prevented effectively. This leads an advantage that a high reliability of the temperature-compensated quartz-crystal oscillator can be maintained and bonding strength between the supporting substrate 6a and the mounting legs 17 can be increased by using the resin material 13.

It is preferred to coat 90% or more of the whole area of the side faces of the mounting legs 17 with the resin material 13. However, even if about 25% of the side faces of the mounting legs 17 are exposed from the upper ends, the other parts should just be coated with the resin material 13. Even in this case, the short-circuit due to adhesion of the solder in the mounting to the external wiring substrate can be prevented effectively and there occurs almost no influence of oxidative corrosion caused by contact with the moisture contained in the atmosphere or the like.

When the exposed parts of the mounting legs 17 are formed from metal such as Ni having excellent solder wetting characteristics, in the mounting to the external wiring substrate such as a main board, there is an advantage that the fillet of solder is formed on the exposed region, thereby increasing the mounting intensity of the temperature-compensated quartz-crystal oscillator.

In the case where the resin material 13 is formed from a transparent material, even when the side faces of the IC device 7 are coated with the resin material 13, the IC device 7 can be directly observed from between the adjacent mounting legs 17. In product inspection or the like, therefore, a junction between the IC device 7 and the supporting substrate 6a can be checked. This also contributes to the improved workability of the inspection.

As described above, the plurality of write control terminals 11 for writing temperature compensation data into the IC device 7 are attached on the bottom face of the supporting substrate 6a.

The height dimension of the write control terminals 11 is set slightly short so that its lower end is located upper than the lower end of the mounting legs 17 and part of the side faces is exposed between the adjacent mounting legs 17.

Since the data writing function of the write control terminals 11 is similar to that described with reference to FIGS. 1 and 2, redundant description will be omitted.

In the temperature-compensated quartz-crystal oscillator of this embodiment, the write control terminals 12 formed of metal bodies are integrated with other components only by being attached at predetermined positions on the bottom face of the supporting substrate 6a. As a result, assembling process of the temperature-compensated quartz-crystal oscillator becomes simplified. This contributes improvement in productivity of the temperature-compensated quartz-crystal oscillator.

In this case, when the above-mentioned resin material 13 is also adhered to the bottom face of the write control terminals 11, in mounting the temperature-compensated quartz-crystal oscillator on the main board by soldering or the like, such a trouble that part of the molten solder comes contact with the write control terminals 11, thereby causing a short-circuit can be prevented effectively. This leads to an easy handling of the temperature-compensated quartz-crystal oscillator.

Thus, the above-mentioned temperature quartz-crystal oscillator is mounted on the external wiring substrate such as a main board by means of soldering or the like and carries out its functions by outputting a given oscillation signal depending on a resonance frequency of the quartz-crystal oscillation device 5 while compensating the oscillation output by a temperature compensating circuit of the IC device 7.

Figure 8:
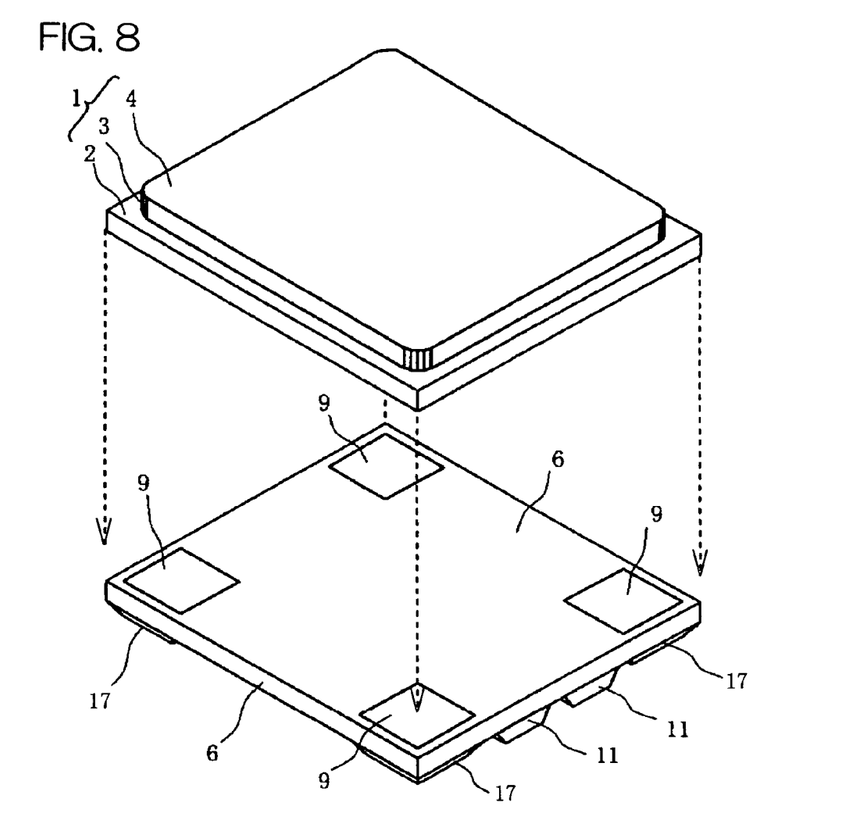
FIG. 8 is an exploded perspective view showing another embodiment of a temperature-compensated quartz-crystal oscillator using the piezoelectric oscillator of the present invention.
Figure 9:
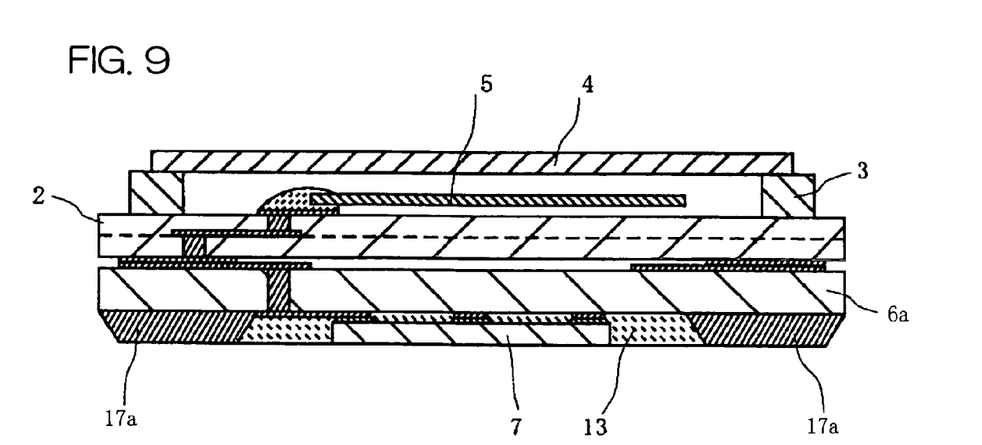
FIG. 9 is a sectional view showing the completed temperature-compensated quartz-crystal oscillator of FIG. 8.
Figure 10:
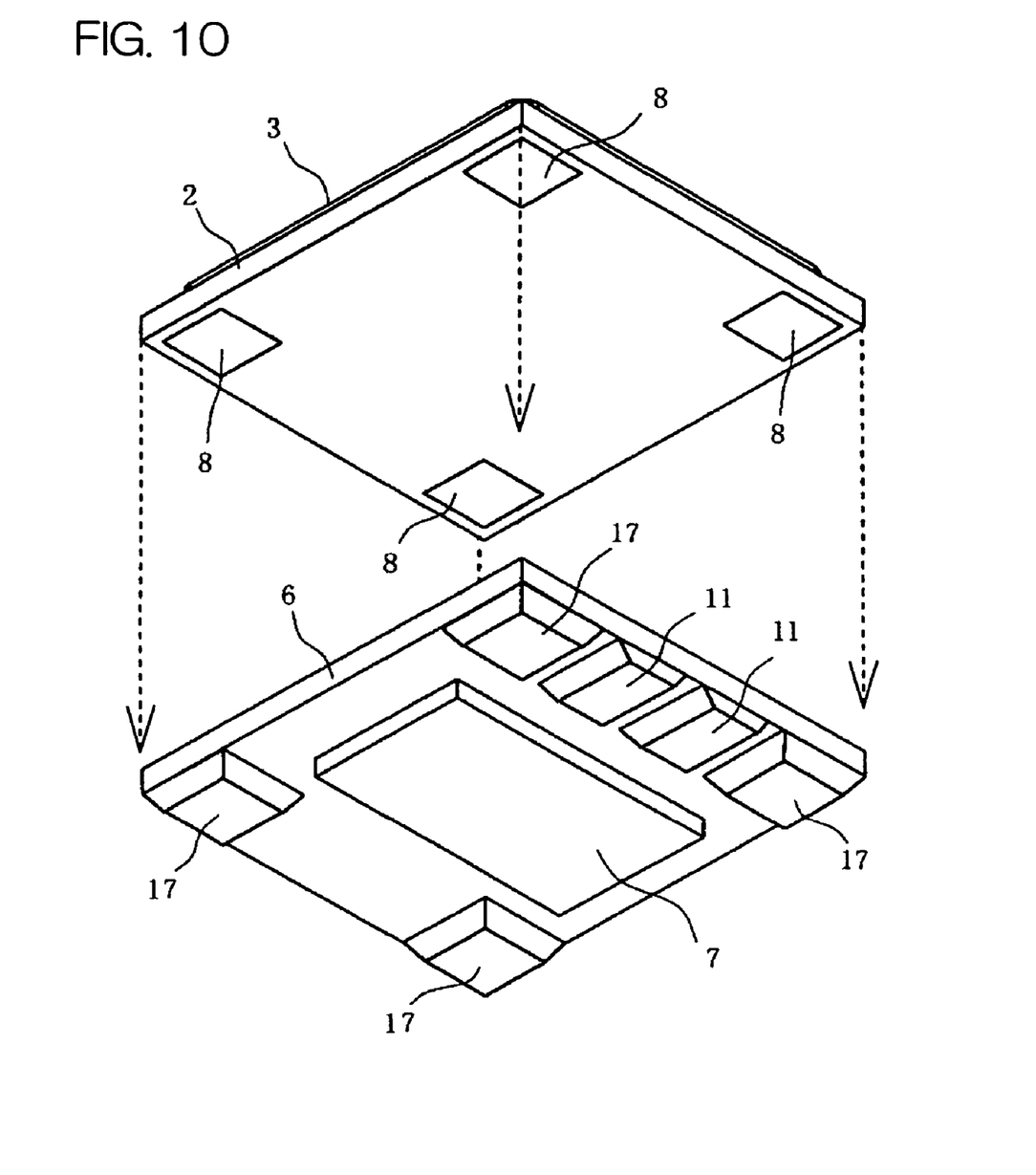
FIG. 10 is an exploded perspective view of the temperature-compensated quartz-crystal oscillator of FIG. 8 when viewed from the bottom.

Next, FIG. 8 is an exploded perspective view showing an embodiment of a temperature-compensated quartz-crystal oscillator using a piezoelectric oscillator of the present invention, FIG. 9 is a cross-sectional view of the temperature-compensated quartz-crystal oscillator in FIG. 8 and FIG. 10 is a bottom view of the temperature-compensated quartz-crystal oscillator in FIG. 8 when viewed from the bottom. In FIGS. 8 and 10, the resin material 13 is omitted.

The temperature-compensated quartz-crystal oscillator shown in FIGS. 8 to 10 has the configuration in which the rectangular package 1 accommodating the quartz-crystal oscillation device 5 therein is fixed on the supporting substrate 6a, and the IC device 7 and a plurality of mounting legs 17a are attached to a bottom face of the supporting substrate 6a.

The configuration of the package 1 is the same as that described with reference to FIG. 1 and the like, and the configuration of the supporting substrate 6a for mounting/fixing the package 1 thereon is the same as that of the supporting substrate 6a described with reference to FIGS. 5 and 6.

However, the shape of the mounting legs 17a is different from that of the mounting legs 17 described with reference to FIGS. 5 and 6. Four side faces of each mounting legs 17a are inclined so that its lower region becomes smaller than its upper region. That is, the mounting legs 17a each are molded in the shape of a quadrangular pyramid. The angle of gradient of the side faces is set up so that the angle which the side faces form with a vertical line may become 5 to 30 degrees.

Although all of the four side faces of each mounting legs 17a are inclined in FIG. 9, all of the four side faces need not be inclined and at least an inner side face of the mounting leg 17a (that is, the side face facing the IC device 7) need only be inclined.

Although the shape of the mounting legs 17a is a quadrangular pyramid in FIG. 9 and the like, the shape is not restricted to the quadrangular pyramid and may be a frustum, hemisphere or triangular pyramid.

By inclining at least the inner side face of the mounting legs 17a so that the lower region may become smaller than the upper region, when the resin material 13 for coating the IC device 7 is introduced, liquid resin before hardening easily flows between the mounting legs 17a and IC device 7, and therefore the sealing property of the IC device 7 can be improved.

Moreover, since the mounting legs 17a are individually attached at four corners on the top face of the supporting substrate 6a and the vertical section of each mounting legs 17a is formed in the shape of a trapezoid, space between the mounting legs 17a and the IC device becomes larger and liquid resin before hardening flows between the mounting legs 17a and the IC device 7 more easily.

The present invention is not restricted to the above-mentioned embodiments and various changes, modifications and the like are possible insofar as they do not deviate from the contents of the present invention.

For example, the above-mentioned embodiments describe the piezoelectric oscillator using the quartz-crystal oscillation device as a piezoelectric oscillation device as an example. Instead of this, however, the present invention can be applied also when the piezoelectric oscillator is configured so as to have a piezoelectric oscillation device other than the quartz-crystal oscillation device, more specifically, a piezoelectric oscillation device such as an elastic surface-wave device or the like.

Further, in the above-mentioned embodiments, the four spacer members 12 or mounting legs 17a are attached at four corners on the top face of the supporting substrate. However, the number of the spacer members 12 or the mounting legs 17a is not limited to four. For example, the present invention can be applied also when three or five spacer members 12 or mounting legs 17a or more are used.

Furthermore, in the above-mentioned embodiments, the number of the write control terminals is set to be an even number, more specifically four. Instead of this, however, the number of the write control terminals may be two, six or odd-number such as three or five.

Figure 11:
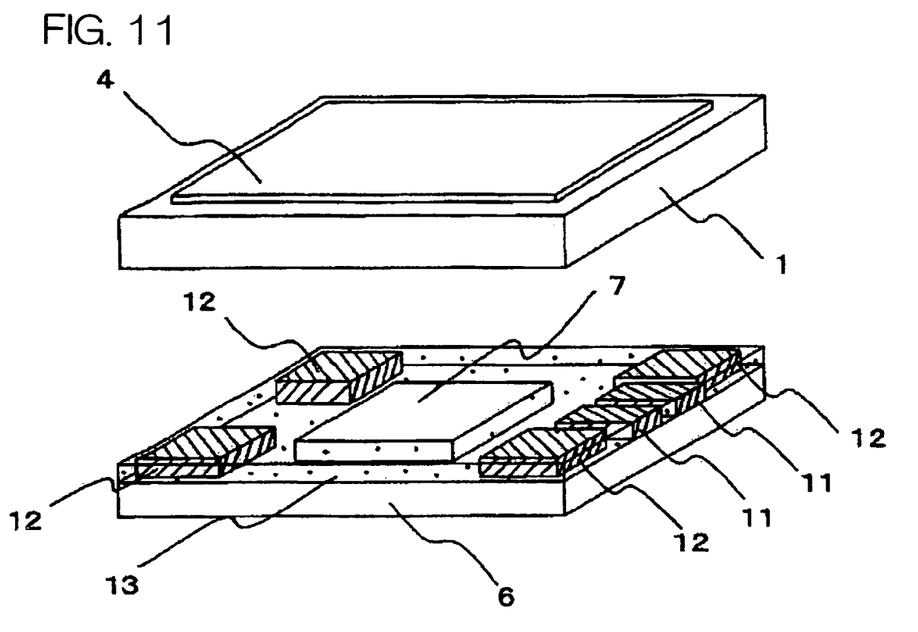
FIG. 11 is an exploded perspective view showing an embodiment of a temperature-compensated quartz-crystal oscillator in which a plurality of write control terminals are arranged in a line along one side of a supporting substrate.
Figure 12:
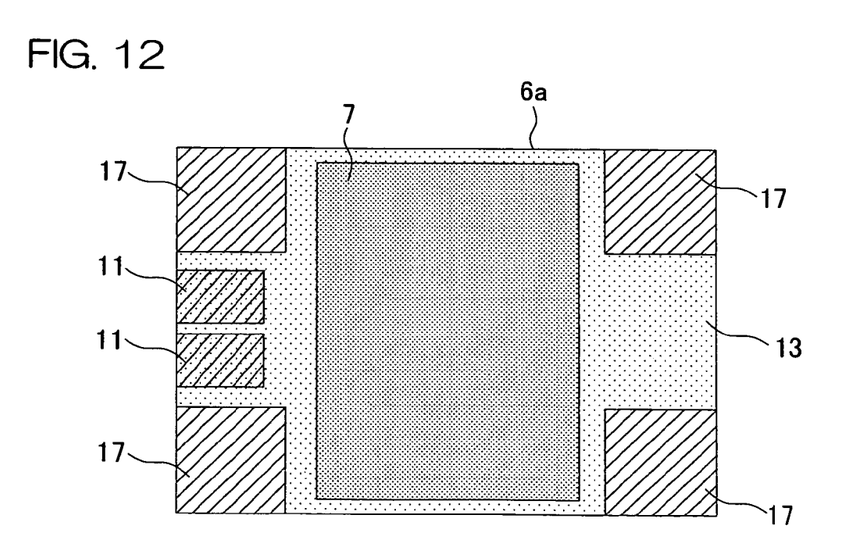
FIG. 12 is an exploded perspective view showing an embodiment of a temperature-compensated quartz-crystal oscillator in which a plurality of write control terminals are arranged in a line along one side of the supporting substrate.

Further, in the above-mentioned embodiments, although a plurality of the write control terminals 11 are divided into two groups and the groups are arranged along the two sides of the supporting substrate 6 or 6a, which are parallel to each other, respectively, the plurality of the write control terminals 11 may be arranged in a line along one side of the supporting substrate 6 as shown in FIG. 11, for example. Alternatively, the plurality of the write control terminals 11 are arranged in a line along one side of the supporting substrate 6a as shown in FIG. 12, for example.

Figure 13:
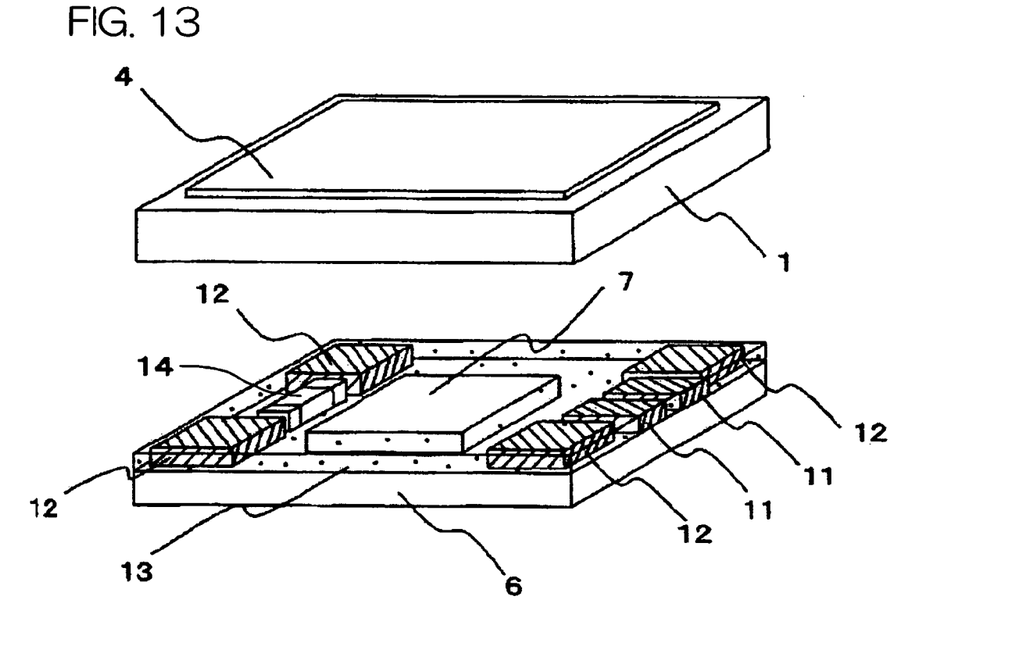
FIG. 13 is an exploded perspective view showing an embodiment of a temperature-compensated quartz-crystal oscillator in which an electronic device other than an IC device is disposed between adjacent spacer members.

Furthermore, in the above-mentioned embodiments as shown in FIG. 13, for example, electronic parts other than the IC device, for example, a chip capacitor for noise removal may be disposed on the top face of the supporting substrate 6 located between adjacent spacer members 12. In this case, since a free space on the top face of the supporting substrate is utilized more efficiently, the piezoelectric oscillator can be further reduced in size.

Figure 14:
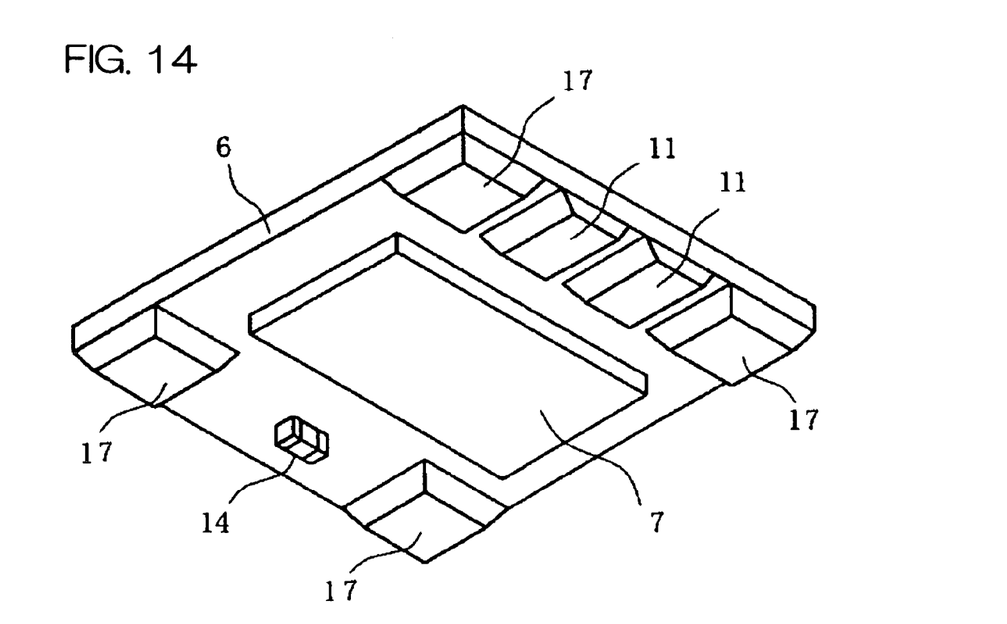
FIG. 14 is an exploded perspective view showing an embodiment of a temperature-compensated quartz-crystal oscillator in which an electronic device other than the IC device is disposed between the adjacent spacer members.

Furthermore, as shown in FIG. 14 (the resin material 13 is omitted), for example, electronic parts other than the IC device, for example, a chip capacitor 14 for noise removal and the like may be disposed on the bottom face of the supporting substrate 6a located between adjacent mounting legs 17. In this case, since a free space on the bottom face of the supporting substrate is utilized more efficiently, the piezoelectric oscillator can be further reduced in size.

The invention claimed is:

1. A piezoelectric oscillator comprising:
   a package for accommodating a piezoelectric oscillation device therein; and
   a supporting substrate on which an IC device for outputting an oscillation signal corresponding to a resonance frequency of said piezoelectric oscillation device is mounted; wherein,
   said package is seated on/fixed to said supporting substrate via spacer members formed of pole-like metal bodies that are arranged along an outer periphery of a main face of said supporting substrate, and
   side faces of said spacer members are coated with a resin material over the whole perimeter.

2. A piezoelectric oscillator as stated in claim 1, wherein said spacer members are attached at four corners on the main face of said supporting substrate.

3. A piezoelectric oscillator as stated in claim 1, wherein said spacer members are electrically connected with wiring conductors of said supporting substrate and connection electrodes of said package.

4. A piezoelectric oscillator as stated in claim 1, wherein at least inner side faces of said spacer members are inclined so that its upper region near said package becomes smaller than its lower region near said supporting substrate and said resin material is adhered to the inclined faces.

5. A piezoelectric oscillator as stated in claim 4, wherein said spacer members are attached at four corners on the surface of said supporting substrate.

6. A piezoelectric oscillator as stated in claim 1, wherein said package and said supporting substrate are formed so as to have the substantially same outside dimension in a plan view.

7. A piezoelectric oscillator as stated in claim 1, wherein part or all of said IC device is partially or wholly coated with said resin material.

8. A piezoelectric oscillator comprising a package for accommodating a piezoelectric oscillation device therein, and a supporting substrate on which an IC device for outputting an oscillation signal corresponding to a resonance frequency of said piezoelectric oscillation device is mounted; wherein said package is seated on/fixed to an other main face of said supporting substrate and mounting legs of pole-like metal bodies are formed along the outer periphery of a main face on the opposite side of the other main face to which said package is fixed.

9. A piezoelectric oscillator as stated in claim 8, wherein said mounting legs are attached at four corners on the main face of said supporting substrate.

10. A piezoelectric oscillator as stated in claim 8, wherein side faces of said mounting legs are coated with said resin material over the whole perimeter.

11. A piezoelectric oscillator as stated in claim 8, wherein said mounting legs, when mounted on a main board, electrically connects terminals of said IC device with wiring conductors of said main board.

12. A piezoelectric oscillator as stated in claim 8, wherein at least inner side faces of said mounting legs are inclined so that its upper region near said supporting substrate becomes larger than its lower region near an opposite end part and said resin material is adhered to the inclined faces.

13. A piezoelectric oscillator as stated in claim 12, wherein said mounting legs are attached at four corners on the surface of said supporting substrate.

14. A piezoelectric oscillator as stated in claim 8, wherein said package and said supporting substrate are formed so as to have the substantially same outside dimension in a plan view.

* * * * *